(12) United States Patent
Cho et al.

(10) Patent No.: US 11,095,285 B2
(45) Date of Patent: Aug. 17, 2021

(54) DRIVING DEVICE OF SEMICONDUCTOR SWITCH

(71) Applicant: ACMEX CO., LTD., Jecheon-si (KR)

(72) Inventors: In Sun Cho, Seoul (KR); Jung Hwan Kim, Yongin-si (KR)

(73) Assignee: ACMEX ALMAZ CO., LTD., Cheongju-si (KR)

( * ) Notice: Subject to any disclaimer, the term of this patent is extended or adjusted under 35 U.S.C. 154(b) by 38 days.

(21) Appl. No.: 15/998,690

(22) PCT Filed: Jun. 12, 2018

(86) PCT No.: PCT/KR2018/006647
§ 371 (c)(1),
(2) Date: Aug. 16, 2018

(87) PCT Pub. No.: WO2019/031699
PCT Pub. Date: Feb. 14, 2019

(65) Prior Publication Data
US 2021/0203319 A1 Jul. 1, 2021

(30) Foreign Application Priority Data

Aug. 10, 2017 (KR) .................. 10-2017-0101508
Sep. 28, 2017 (KR) .................. 10-2017-0125875

(51) Int. Cl.
*H03B 1/00* (2006.01)
*H03K 3/00* (2006.01)
*H03K 17/56* (2006.01)

(52) U.S. Cl.
CPC ..... *H03K 17/56* (2013.01); *H03K 2217/0081* (2013.01)

(58) Field of Classification Search
CPC ....... H03K 19/00361; H03K 19/00315; H03K 19/00384; H04L 25/028; H04L 25/0272;
(Continued)

(56) References Cited

U.S. PATENT DOCUMENTS

2014/0277802 A1* 9/2014 Tomas ................. G06F 1/28
700/292
2017/0054440 A1* 2/2017 Katsumata ............ H03K 5/24

FOREIGN PATENT DOCUMENTS

JP 2005-151767 6/2005
KR 2003-0030452 4/2003
(Continued)

OTHER PUBLICATIONS

International Search Report for International Application No. PCT/KR2018/006647, dated Aug. 30, 2018.
(Continued)

*Primary Examiner* — Quan Tra
(74) *Attorney, Agent, or Firm* — Kile Park Reed & Houtteman PLLC

(57) ABSTRACT

A driving device of a semiconductor switch includes a semiconductor switch configured to perform a switching operation by a gate driving voltage, and transfer a main power connected to a first switch terminal, to a load connected to a second switch terminal; a control signal generation circuit configured to detect a change in a control signal input power and generate and output a corresponding control signal, based on a lower negative voltage between negative voltages of the main power and the control signal input power; a control signal detection circuit configured to detect the control signal and output a corresponding driving control signal; a gate driving voltage generation circuit configured to be driven by the driving control signal and output the gate driving voltage; and an internal power generation circuit configured to be supplied with the main power, and generate a power supply voltage.

7 Claims, 4 Drawing Sheets

(58) Field of Classification Search
CPC ......... G11C 5/147; G05F 1/465; G05F 3/205;
G05F 3/262; H04B 1/1623
USPC ........................................ 327/108–112, 530
See application file for complete search history.

(56) References Cited

FOREIGN PATENT DOCUMENTS

| KR | 10-2011-0101076 | 9/2011 |
| KR | 10-1467717 | 12/2014 |
| KR | 10-2017-0009126 | 1/2017 |

OTHER PUBLICATIONS

Written Opinion for International Application No. PCT/KR2018/006647 with English translations, dated Aug. 30, 2018.

* cited by examiner

DRIVING DEVICE OF SEMICONDUCTOR SWITCH

TECHNICAL FIELD

The present disclosure relates to a driving technology of a semiconductor switch element and, more particularly, to a driving device of a semiconductor switch which allows a relay circuit to be easily replaced with a semiconductor switch and allows a driving device to be implemented by one chip.

BACKGROUND ART

In recent years, a number of electronic devices are applied to a moving means such as an automobile or a motorcycle, and a number of mechanical relay circuits are used to control the driving of the electronic devices. For example, 30 to 50 mechanical relay devices are used in the case of an automobile.

However, there is a likelihood that the switching contact of a mechanical relay circuit wears quickly and thereby causes the malfunction of a control device. Therefore, there is a need to replace the relay circuit with a semiconductor switch which is excellent in terms of abrasion resistance and is not significantly influenced by electromagnetic interference (EMI).

FIG. 1 is a block diagram illustrating a representation of an example of a driving device of a semiconductor switch according to the conventional art, which is applied to a moving means such as an automobile or a motorcycle. As shown in FIG. 1, a driving device 10 includes a semiconductor switch 11, a control signal generation circuit 12, a control signal detection circuit 13, a gate driving voltage generation circuit 14, a load 15 and an internal power generation circuit 16.

The semiconductor switch 11 performs a switching operation by a gate driving voltage GDV supplied to the gate thereof. When the semiconductor switch 11 is turned on, a main power Vin1 is supplied to the load 15 through the semiconductor switch 11, and the load 15 is driven. When the semiconductor switch 11 is turned off, the path of the main power Vin1 for the load 15 is cut off, and the driving of the load 15 is interrupted.

The control signal generation circuit 12 plays the role of generating a control signal. To this end, the control signal generation circuit 12 includes a switch SW1 which is connected between a control signal input terminal P3 and a ground terminal. The switch SW1 may be implemented by a MOSFET or a bipolar transistor.

The switch SW1 of the control signal generation circuit 12 performs a switching operation such that current flows from the control signal input terminal P3 toward the negative (−) terminal of the main power Vin1 or the potential of the control signal input terminal P3 becomes ground potential.

The control signal detection circuit 13 detects that a control signal is inputted from the switch SW1 by the above switching operation, and accordingly, outputs a driving control signal DCS.

The gate driving voltage generation circuit 14 outputs the gate driving voltage GDV to the semiconductor switch 11 when the driving control signal DCS is supplied from the control signal detection circuit 13.

The internal power generation circuit 16 plays the role of receiving the main power Vin1 and supplying a power supply voltage VDD which is needed in the semiconductor switch 11, the control signal detection circuit 13 and the gate driving voltage generation circuit 14.

The driving device which adopts the semiconductor switch 11 as a driving target switch has a structure capable of using the ground voltage of the load 15 as the ground voltage of the control signal generation circuit 12, whereas a relay circuit has a structure in which the terminals of a relay coil and the terminals of a relay switch are electrically completely separated.

In this regard, since the driving device of a semiconductor switch according to the conventional art cannot accommodate the relay circuit having the structure in which the terminals of a relay coil and the terminals of a relay switch are electrically completely separated, a problem is caused in that the driving device of a semiconductor switch according to the conventional art cannot be used to replace the relay circuit.

DISCLOSURE

Technical Problem

Various embodiments are directed to providing a driving device of a semiconductor switch which has a structure capable of being used in such a way as to replace a relay circuit having a structure in which the terminals of a relay coil and the terminals of a relay switch are electrically completely separated, and allowing the driving device of a semiconductor switch to be implemented by one chip.

Technical Solution

In an embodiment, a driving device of a semiconductor switch may include: a semiconductor switch configured to perform a switching operation by a gate driving voltage, and transfer a main power connected to a first switch terminal, to a load connected to a second switch terminal; a control signal generation circuit configured to detect a change in a control signal input power and output a corresponding control signal, the control signal generation circuit generating and outputting the control signal based on a lower negative voltage between a negative voltage of the main power and a negative voltage of the control signal input power; a control signal detection circuit configured to detect the control signal and output a corresponding driving control signal; a gate driving voltage generation circuit configured to be driven by the driving control signal and output the gate driving voltage; and an internal power generation circuit configured to be supplied with the main power when the semiconductor switch is in a turned-off state, and generate a power supply voltage which is needed in the semiconductor switch, the control signal generation circuit, the control signal detection circuit and the gate driving voltage generation circuit.

Advantageous Effects

According to the embodiment, by providing a driving device of a semiconductor device which has a structure capable of being used in such a way as to replace a relay circuit applied to an electronic device of a moving means such as an automobile or a motorcycle, it is possible to prevent the malfunction of the electronic device and extend the lifetime of the electronic device.

Further, according to the embodiment, by allowing the driving device of a semiconductor switch to be implemented by one chip, it is possible to reduce the manufacturing cost and decrease the size of a product.

MODE FOR DISCLOSURE

Figure 1:
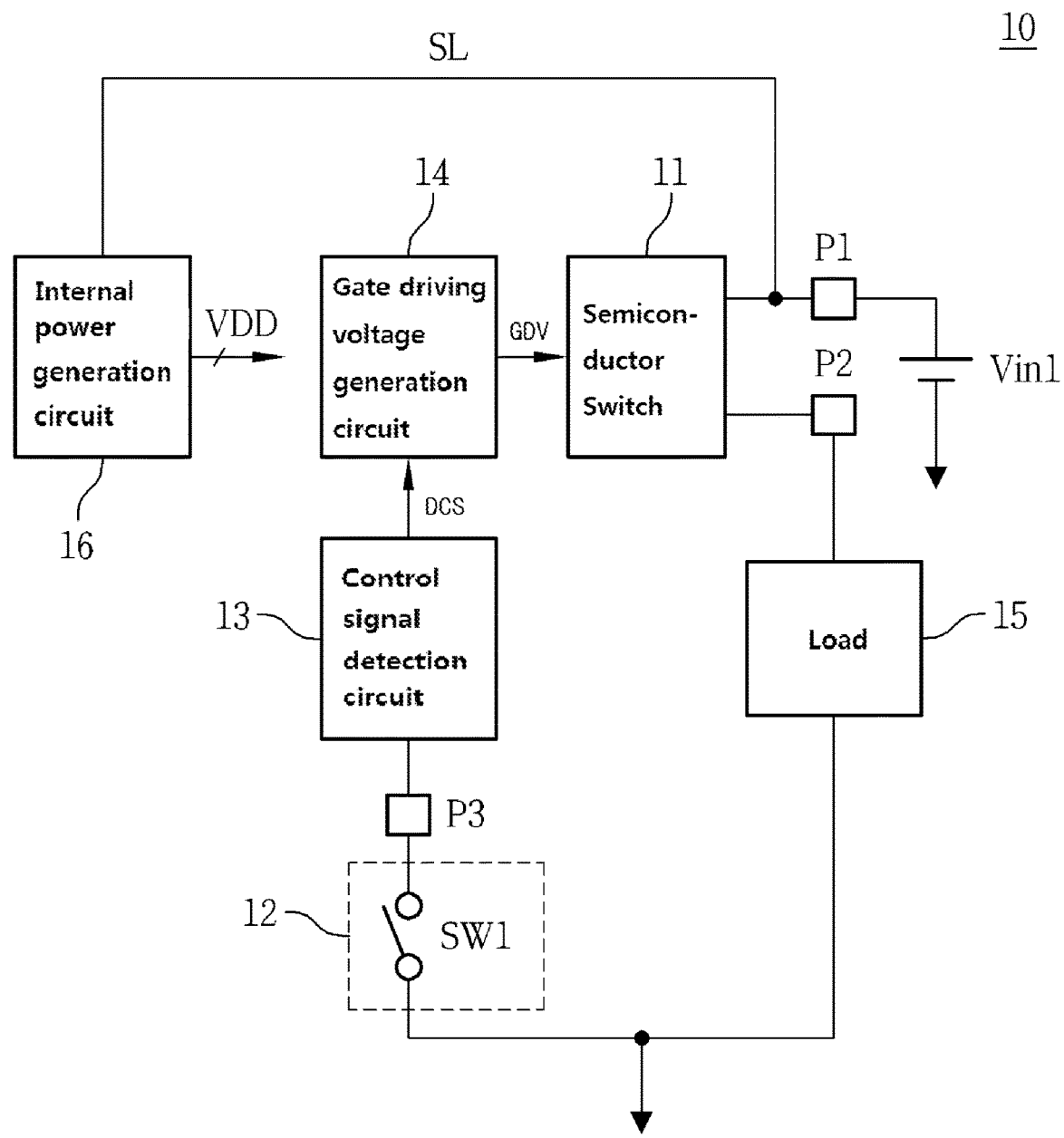
FIG. 1 is a block diagram illustrating a representation of an example of a driving device of a semiconductor switch according to the conventional art, which is applied to a moving means such as an automobile or a motorcycle.
Figure 2:
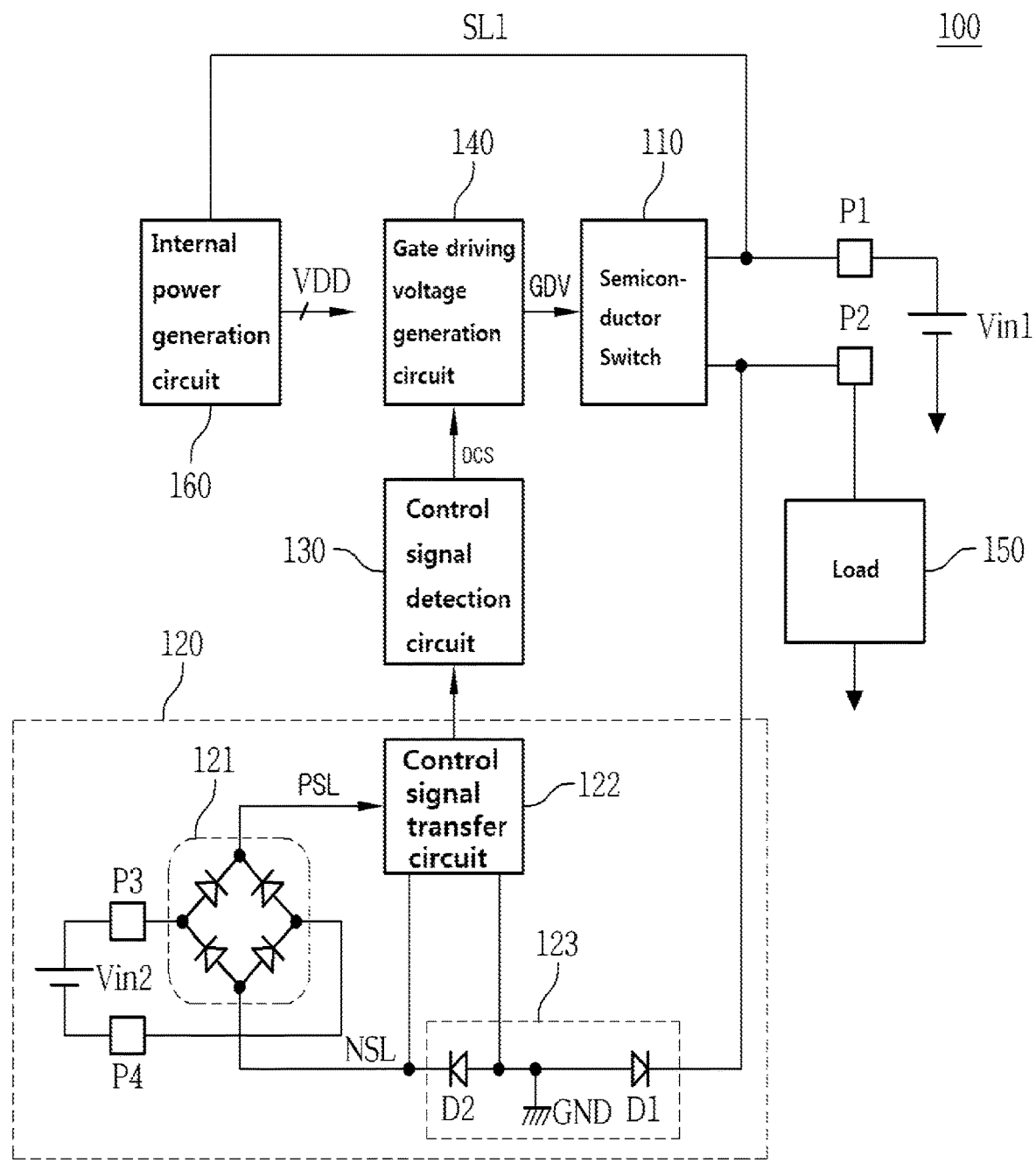
FIG. 2 is a block diagram illustrating a representation of an example of a driving device of a semiconductor switch in accordance with an embodiment.

FIG. 2 is a block diagram illustrating a representation of an example of a driving device of a semiconductor switch in accordance with an embodiment. As shown in FIG. 2, a driving device 100 includes a semiconductor switch 110, a control signal generation circuit 120, a control signal detection circuit 130, a gate driving voltage generation circuit 140, a load 150 and an internal power generation circuit 160.

In the driving device 100, since a mechanical relay circuit is omitted, the respective circuits except the load 150 may be implemented by one chip.

The semiconductor switch 110 includes two switch terminals P1 and P2. Between the two switch terminals P1 and P2, the switch terminal P1 is connected to the positive (+) terminal of a main power Vin1 for driving the load 150, and the switch terminal P2 is connected to a negative (−) power through the load 150. Therefore, when the semiconductor switch 110 is turned on by a gate driving voltage GDV supplied to the gate thereof, the main power Vin1 is connected to the load 150 through the switch terminal P1, the semiconductor switch 110 and the switch terminal P2, and thereby, the load 150 is driven. The potential difference between the switch terminals P1 and P2 may be several volts to several tens of volts. When the semiconductor switch 110 is turned off by the gate driving voltage GDV, the supply path of the main power Vin1 is cut off, and the driving of the load 150 is interrupted.

The type of the semiconductor switch 110 is not specifically limited, and may be implemented by a MOSFET, an IGBT (insulated gate bipolar mode transistor) or a bipolar transistor. In the case where it is necessary to implement the driving device 100 by one chip and reduce the on-resistance of a switch, the semiconductor switch 110 may be implemented by an N-type MOSFET (NMOSFET).

In the case where the semiconductor switch 110 is implemented by an NMOSFET, in order to turn on the semiconductor switch 110, the voltage of the gate should be higher than the voltage of the source terminal. When the semiconductor switch 110 is turned on, the value of on-resistance is substantially small, and thus, a source voltage and a drain voltage become almost equal. The gate terminal of the NMOSFET should be supplied with the gate driving voltage GDV higher than the source terminal. To this end, the gate driving voltage generation circuit 140 may include a charge pump.

The control signal generation circuit 120 generates a control signal for controlling the switching operation of the semiconductor switch 110. To this end, the control signal generation circuit 120 includes a control signal input power Vin2, a bridge diode 121, a control signal transfer circuit 122 and a ground voltage circuit 123.

The control signal input power Vin2 generates a voltage for controlling the switching operation of the semiconductor switch 110. The positive terminal of the control signal input power Vin2 is connected to a control signal input terminal P3, and the negative terminal of the control signal input power Vin2 is connected to a control signal input terminal P4. The potential difference between the control signal input terminals P3 and P4 may be several volts.

The bridge diode 121 rectifies and outputs the control signals supplied through the control signal input terminals P3 and P4. To this end, both input terminals of the bridge diode 121 are connected to the control signal input terminals P3 and P4, respectively, and, between both output terminals of the bridge diode 121, the positive output terminal is connected to a positive signal line PSL and the negative output terminal is connected to a negative signal line NSL.

The control signal transfer circuit 122 plays the role of transferring the control signals supplied through the positive signal line PSL and the negative signal line NSL, to a next stage.

The ground voltage circuit 123 serves to maintain the voltage of an internal ground terminal GND at a lower voltage between the negative voltage of the main power Vin1 and the negative voltage of the control signal input power Vin2. To this end, the ground voltage circuit 123 includes a diode D1 which is connected between the internal ground terminal GND and the switch terminal P2 and a diode D2 which is connected between the internal ground terminal GND and the negative output terminal of the bridge diode 121.

The control signal detection circuit 130 detects the control signal generated through the above-described process in the control signal generation circuit 120, and accordingly, outputs a driving control signal DCS.

The gate driving voltage generation circuit 140 is driven by the driving control signal DCS supplied from the control signal detection circuit 130, and outputs the gate driving voltage GDV to the semiconductor switch 110.

The internal power generation circuit 160 plays the role of receiving the main power Vin1 when the semiconductor switch 110 is in a turned-off state and supplying a power supply voltage VDD which is needed in the semiconductor switch 110, the control signal generation circuit 120, the control signal detection circuit 130 and the gate driving voltage generation circuit 140. To this end, one terminal of the internal power generation circuit 160 is connected to the positive terminal of the main power Vin1 through the switch terminal P1, and the other terminal of the internal power generation circuit 160 is connected to the internal ground terminal GND. The internal ground terminal GND is supplied with a lower voltage between the negative voltage of the main power Vin1 and the negative voltage of the control signal input power Vin2.

Figure 3:
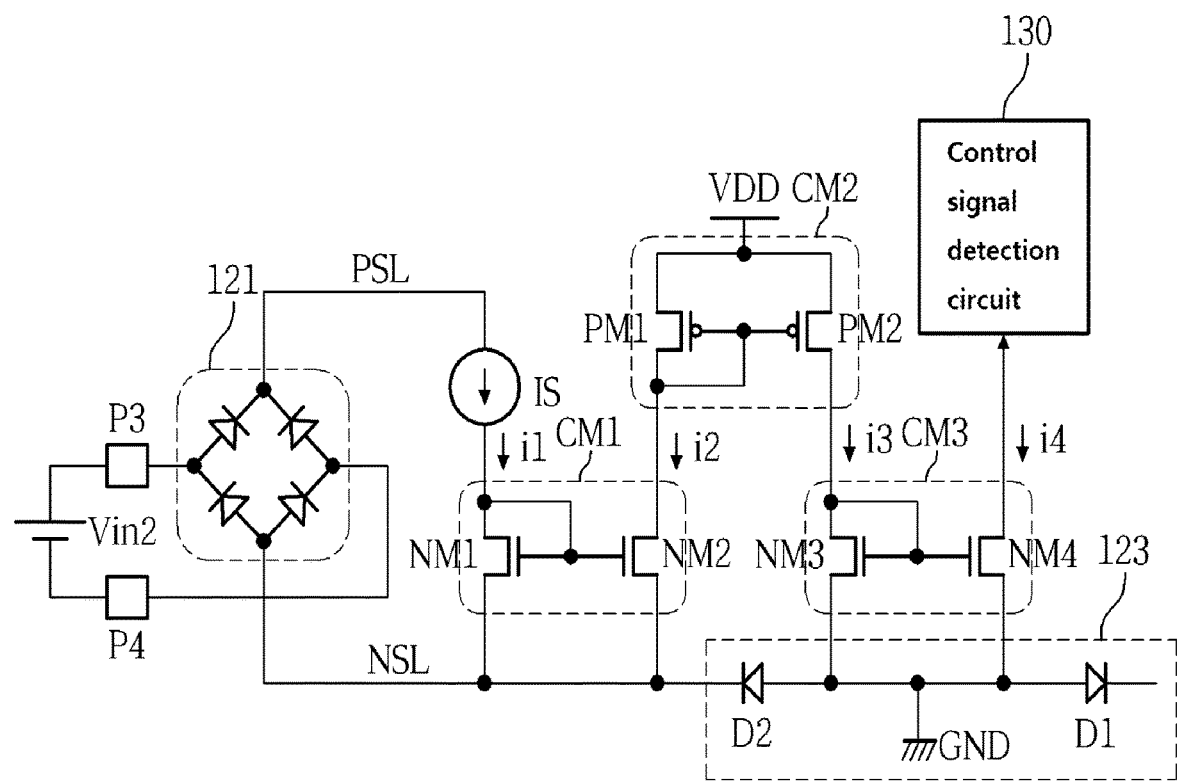
FIG. 3 is a circuit diagram illustrating a representation of an implementation example of a control signal transfer circuit in accordance with an embodiment.

FIG. 3 is a circuit diagram illustrating a representation of an implementation example of the control signal transfer circuit 122 in accordance with an embodiment. As shown in FIG. 3, the control signal transfer circuit 122 includes a constant current source IS and first to third current mirrors CM1 to CM3.

One terminal of the constant current source IS is connected to the positive output terminal of the bridge diode 121 through the positive signal line PSL.

The first current mirror CM1 includes N-channel MOS transistors (hereinafter, referred to as 'NMOS transistors') NM1 and NM2 of which gates are connected in common. The drain and the gate of the NMOS transistor NM1 are connected in common to the other terminal of the constant current source IS. The sources of the NMOS transistors NM1 and NM2 are connected in common to the negative output terminal of the bridge diode 121 through the negative signal line NSL.

When the control signal input power Vin2 is outputted at a level for turning on the semiconductor switch 110, the voltage difference between the positive signal line PSL and the negative signal line NSL becomes equal to or larger than a reference value, current i1 flows from the constant current source IS toward the negative signal line NSL through the NMOS transistor NM1 of the first current mirror CM1. Since the NMOS transistors NM1 and NM2 are connected in the structure of a current mirror, current i2 corresponding to the current i1 flows toward the negative signal line NSL through the NMOS transistor NM2.

The second current mirror CM2 includes P-channel MOS transistors (hereinafter, referred to as 'PMOS transistors') PM1 and PM2 of which gates are connected in common. The sources of the PMOS transistors PM1 and PM2 are connected in common to the terminal of the power supply voltage VDD, and the gate and the drain of the PMOS transistor PM1 are connected in common to the input terminal of the current i2 of the first current mirror CM1.

Current i3 corresponding to the current i2 flowing toward the negative signal line NSL through the terminal of the power supply voltage VDD and the PMOS transistor PM1 of the second current mirror CM2 and the NMOS transistor NM2 of the first current mirror CM1 flows through the PMOS transistor PM2 which is connected in the structure of a current mirror with the PMOS transistor PM1.

The third current mirror CM3 includes NMOS transistors NM3 and NM4 of which gates are connected in common. The drain and the gate of the NMOS transistor NM3 are connected in common to the output terminal of the current i3 of the second current mirror CM2. The sources of the NMOS transistors NM3 and NM4 are connected in common to the internal ground terminal GND. The current i3 flows to the internal ground terminal GND through the NMOS transistor NM3, and current i4 corresponding thereto flows to the internal ground terminal GND through the NMOS transistor NM4 which is connected in the structure of a current mirror with the NMOS transistor NM3.

Therefore, the control signal transferred to the control signal detection circuit 130 from the control signal transfer circuit 122 is a signal corresponding to the current i4.

Figure 4:
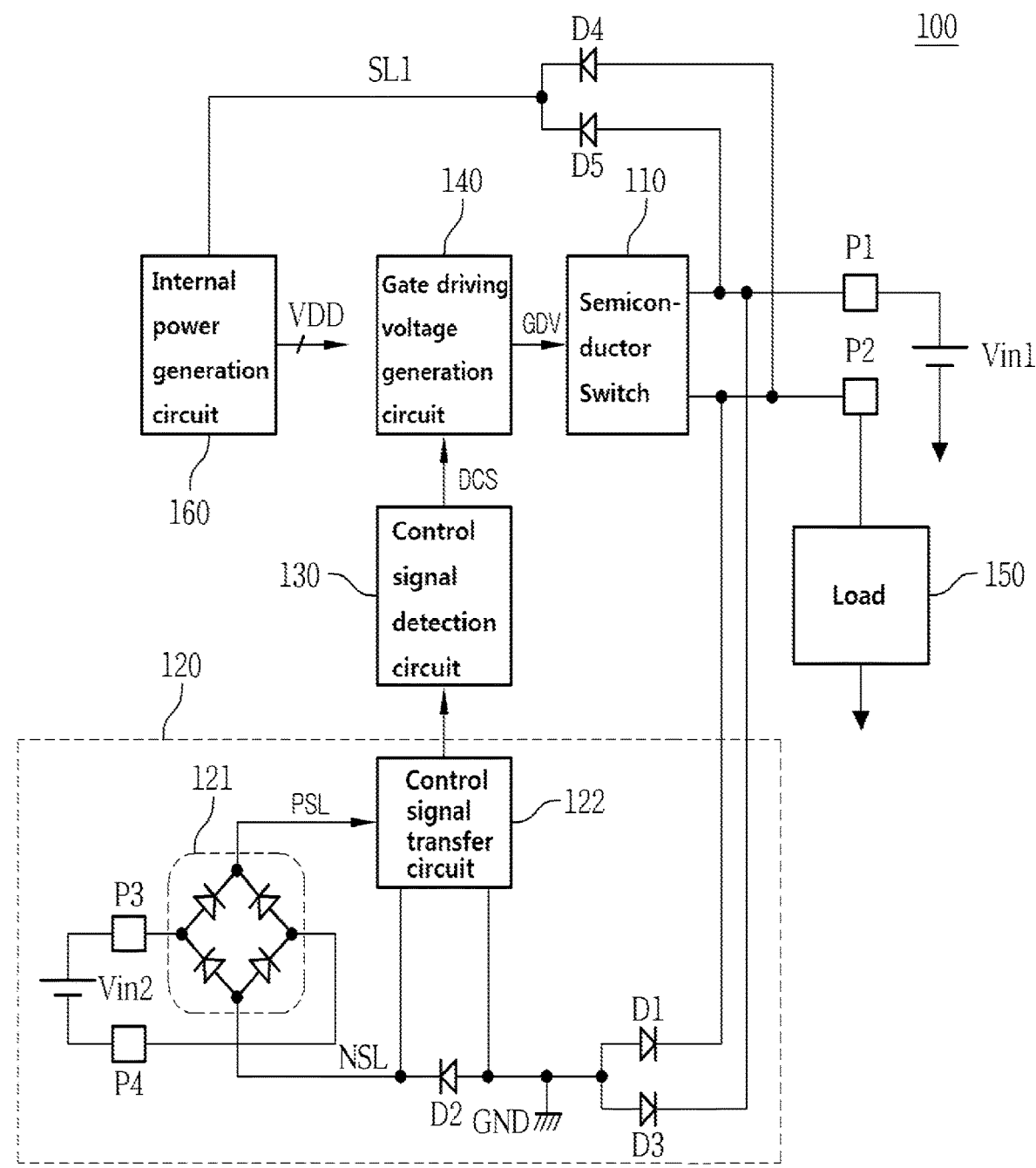
FIG. 4 is a block diagram illustrating a representation of an example for allowing a semiconductor switch to be used by being connected in a non-polarity type in accordance with an embodiment.

FIG. 4 is a block diagram illustrating a representation of an example for allowing a semiconductor switch 110 to be used by being connected in a non-polarity type in accordance with an embodiment. In the case where the semiconductor switch 110 is configured to be used by being connected in a non-polarity type, the positive terminal and the negative terminal of a main power Vin1 may be connected to switch terminals P1 and P2 without distinction. In this case, in order to allow a positive voltage to be always supplied to an internal power generation circuit 160, diodes D1 and D3 are connected in parallel between an internal ground terminal GND and the switch terminals P1 and P2 and diodes D4 and D5 are connected in parallel between the switch terminals P1 and P2 and the input terminal of the internal power generation circuit 160.

While various embodiments have been described above, it will be understood to those skilled in the art that the embodiments described are by way of example only. Accordingly, the disclosure described herein should not be limited based on the described embodiments.

The invention claimed is:

1. A driving device of a semiconductor switch, comprising:
   a semiconductor switch configured to perform a switching operation by a gate driving voltage, and transfer a main power connected to a first switch terminal, to a load connected to a second switch terminal;
   a control signal generation circuit configured to detect a change in a control signal input power and output a corresponding control signal, the control signal generation circuit generating and outputting the control signal based on a lower negative voltage between a negative voltage of the main power and a negative voltage of the control signal input power;
   a control signal detection circuit configured to detect the control signal and output a corresponding driving control signal;
   a gate driving voltage generation circuit configured to be driven by the driving control signal and output the gate driving voltage; and
   an internal power generation circuit configured to be supplied with the main power when the semiconductor switch is in a turned-off state, and generate a power supply voltage which is needed in the semiconductor switch, the control signal generation circuit, the control signal detection circuit and the gate driving voltage generation circuit.

2. The driving device according to claim 1, wherein the semiconductor switch is any one among a MOSFET, an IGBT (insulated gate bipolar mode transistor) and a bipolar transistor.

3. The driving device according to claim 1, wherein the control signal generation circuit comprises:
   a control signal input power configured to generate a voltage for controlling a switching operation of the semiconductor switch;
   a bridge diode configured to rectify and output the control signal input power;
   a control signal transfer circuit configured to transfer control signals supplied through the bridge diode, to a next stage; and
   a ground voltage circuit configured to maintain a lower voltage between a negative voltage of the main power and a negative voltage of the control signal input power, as a voltage of an internal ground terminal, such that a control signal to be outputted from the control signal transfer circuit is outputted based on the voltage of the internal ground terminal.

4. The driving device according to claim 3, wherein both input terminals of the bridge diode are connected to a positive terminal and a negative terminal of the control signal input power, and both output terminals of the bridge diode are connected to a positive signal line and a negative signal line.

5. The driving device according to claim 3, wherein the control signal transfer circuit comprises:
   a constant current source connected to a positive output terminal of the bridge diode; and first to third current mirrors configured to dependently perform current mirroring in correspondence to output current of the constant current source.

6. The driving device according to claim 3, wherein the ground voltage circuit comprises:
   a first diode connected between an internal ground terminal and the second switch terminal; and
   a second diode connected between the internal ground terminal and a negative output terminal of the bridge diode.

7. The driving device according to claim 1, further comprising:
   diodes connected in parallel between the first switch terminal and the second switch terminal and an input terminal of the internal power generation circuit, in correspondence to that the semiconductor switch is configured in a non-polarity type; and
   diodes connected in parallel between an internal ground terminal of the control signal generation circuit and the first switch terminal and the second switch terminal.

* * * * *